(12) United States Patent
Matsunaga et al.

(10) Patent No.: US 12,375,831 B2
(45) Date of Patent: Jul. 29, 2025

(54) IMAGE SENSOR HAVING PIXELS IN LINEAR MODE AND PHOTOVOLTAIC MODE

(71) Applicant: OmniVision Technologies, Inc., Santa Clara, CA (US)

(72) Inventors: Yoshiyuki Matsunaga, Kyoto (JP); Keiji Mabuchi, Cupertino, CA (US); Lindsay Grant, Campbell, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 126 days.

(21) Appl. No.: 18/391,241

(22) Filed: Dec. 20, 2023

(65) Prior Publication Data

US 2025/0211870 A1    Jun. 26, 2025

(51) Int. Cl.
*H04N 25/60* (2023.01)
*H04N 25/77* (2023.01)
*H10F 39/18* (2025.01)

(52) U.S. Cl.
CPC .............. *H04N 25/60* (2023.01); *H04N 25/77* (2023.01); *H10F 39/18* (2025.01)

(58) Field of Classification Search
CPC ......... H04N 25/60; H04N 25/77; H10F 39/18
See application file for complete search history.

(56) References Cited

U.S. PATENT DOCUMENTS

| | | | |
|---|---|---|---|
| 7,339,217 B2 * | 3/2008 | Rhodes | H10F 39/803 257/292 |
| 7,586,523 B2 | 9/2009 | Egawa et al. | |
| 7,911,507 B2 * | 3/2011 | Egawa | H04N 25/589 348/230.1 |
| 10,250,828 B1 * | 4/2019 | Xu | H04N 25/616 |
| 10,250,932 B2 * | 4/2019 | Chen | H04N 25/79 |

* cited by examiner

*Primary Examiner* — Marly S Camargo

(57) ABSTRACT

In a case where a photodiode is in a saturated state, the photodiode can be transited from the saturated state to an unsaturated state during a period when a knee pulse is supplied from a knee pulse supplying unit. The knee pulse supplying unit preferably supplies the knee pulse a plurality of times during one frame period.

8 Claims, 7 Drawing Sheets

IMAGE SENSOR HAVING PIXELS IN LINEAR MODE AND PHOTOVOLTAIC MODE

TECHNICAL FIELD

The present disclosure generally relates to an image sensor including a plurality of pixels, in particular each pixel operating in linear mode and photovoltaic mode.

BACKGROUND INFORMATION

An image sensor includes a plurality of pixels, and each of the pixels output a signal corresponding to an incident light to obtain a two-dimensional image. Each of the pixels normally obtains the signal corresponding to an incident light amount for each frame.

The image sensor is desired to have a dynamic range as wide as possible. One example has disclosed a technique in which a high-sensitivity signal of a long accumulation period and a low-sensitivity signal of a short accumulation period are added to obtain a signal of a wide dynamic range.

A light amount of an LED is controlled by PWM control. Therefore, on/off of light emission is repeated at a predetermined frequency. Thus, when the image sensor acquires an image, an image when the light emission is on and an image when the light emission is off are mixed to cause a flicker.

Another example has disclosed a technique in which a peak hold circuit is provided in each of the pixels to hold a peak of the signal, thereby removing the flicker.

SUMMARY

An image sensor according to the present disclosure includes a plurality of pixels. Each of the pixels includes a photodiode configured to operate in a linear mode in which the photodiode shows a linear response to incident light and also in a photovoltaic mode in which the photodiode shows a logarithmic response to the incident light, a reset transistor configured to reset the photodiode, a peak hold circuit configured to integrate an output of the photodiode, wherein the peak hold circuit includes (1) a peak hold transistor configured to receive an output of the photodiode at a gate, (2) a switch transistor configured to turn on/off an output of the peak hold transistor, and (3) a holding capacitor configured to accumulate an output of the switch transistor, and a knee pulse supplying unit connected to an output end of the photodiode through a knee capacitor and configured to supply a knee pulse for shifting a voltage at the output end of the photodiode for a predetermined period. In a case where the photodiode is in a saturated state, the photodiode can be transited from the saturated state to an unsaturated state during a period when the knee pulse is supplied from the knee pulse supplying unit.

The knee pulse supplying unit preferably supplies the knee pulse a plurality of times during one frame period.

By the knee pulse, the saturated state of the photodiode may be temporarily canceled, and the dynamic range may be widened. Further, providing the peak hold circuit may make it possible to suppress occurrence of a flicker.

BRIEF DESCRIPTION OF THE DRAWINGS

Embodiment(s) of the present disclosure will be described based on the following figures, wherein.

DESCRIPTION OF EMBODIMENTS

An embodiment of the present disclosure is described below with reference to drawings. The following embodiment does not limit the present disclosure, and configurations obtained by selectively combining a plurality of illustrations are also included in the present disclosure.

Configuration of Pixel Circuit

Figure 1:
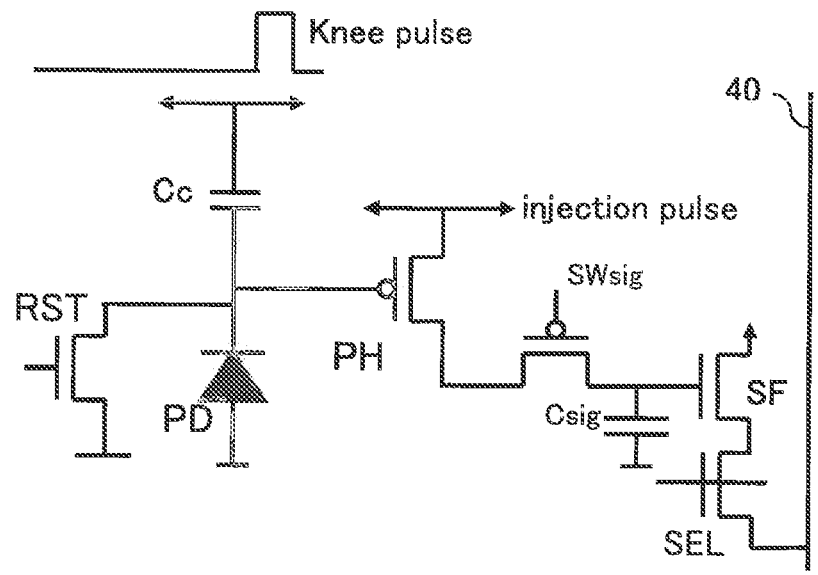
FIG. 1 is a diagram illustrating a configuration of a pixel circuit according to the present disclosure.

FIG. 1 is a diagram illustrating a configuration of a pixel circuit according to the present disclosure. A photodiode PD accumulates charges (electrons in this case) based on incident light. The photodiode PD operates both in a linear mode in which the photodiode PD shows a linear response to the incident light and in a photovoltaic mode in which the photodiode PD shows a logarithmic response to the incident light. A cathode of the photodiode PD serves as an output end, and an anode is connected to a power supply (e.g., ground).

One end (drain) of a reset transistor RST is connected to the output end of the photodiode PD, and the other end (source) of the reset transistor RST is connected to a predetermined power supply. In this example, the reset transistor RST is an n-channel transistor.

The output end of the photodiode PD is connected to a gate of a peak hold transistor PH. The peak hold transistor PH is a p-channel transistor. A source of the peak hold transistor PH is connected to an injection power supply.

A source of a switch transistor SWsig is connected to a drain of the peak hold transistor PH. One end of a holding capacitor Csig is connected to a drain of the switch transistor SWsig. The other end of the holding capacitor Csig is connected to a power supply (e.g., ground). The switch transistor SWsig is a p-channel transistor.

The peak hold transistor PH, the switch transistor SWsig, and the holding capacitor Csig configure a peak hold circuit.

The drain of the switch transistor SWsig is connected to a gate of a source follower transistor SF. A drain of the source follower transistor SF is connected to a power supply, and a source is connected to a drain of a selection transistor SEL. A source of the selection transistor SEL is connected to an output line 40.

A row selection signal is supplied to a gate of the selection transistor SEL. When the row selection signal becomes an H level, a signal corresponding to a gate voltage of the source follower transistor SF is output to the output line 40.

After the reset transistor RST is turned on to reset the photodiode PD, the switch transistor SWsig are turned on, and an injection pulse is applied to the source of the peak hold transistor, thereby injecting charges (holes) into the holding capacitor Csig, and discharging excess charges through the peak hold transistor PH. As a result, the holding capacitor Csig is put into a reset state.

In this state, a signal supplied from the peak hold transistor PH is accumulated in the holding capacitor Csig through the switch transistor SWsig during one frame period. As described above, the output voltage corresponding to the accumulated charges of the photodiode PD is supplied to the gate of the peak hold transistor PH. Therefore, charges corresponding to the incident light amount of the photodiode PD during one frame period are accumulated in the holding capacitor Csig.

Further, when the switch transistor SWsig is turned off and the selection transistor SEL is turned on, a voltage signal corresponding to the charges accumulated in the holding capacitor Csig is read out to the output line 40.

A knee pulse supplying unit is connected to the output end of the photodiode PD through a knee capacitor Cc. The knee pulse supplying unit is a power supply generating a knee pulse, and the generated knee pulse is applied to the output end of the photodiode PD through the knee capacitor Cc.

The knee pulse is a short-period positive pulse. When the knee pulse is applied, a voltage at the output end of the photodiode PD is shifted to a lower side. In other words, the voltage is shifted only during a predetermined period when the knee pulse is at an H level. Therefore, in a case where the photodiode PD is in a saturated state, the photodiode PD can be transited to an unsaturated state. The voltage is shifted by a height of the knee pulse.

Figure 2:
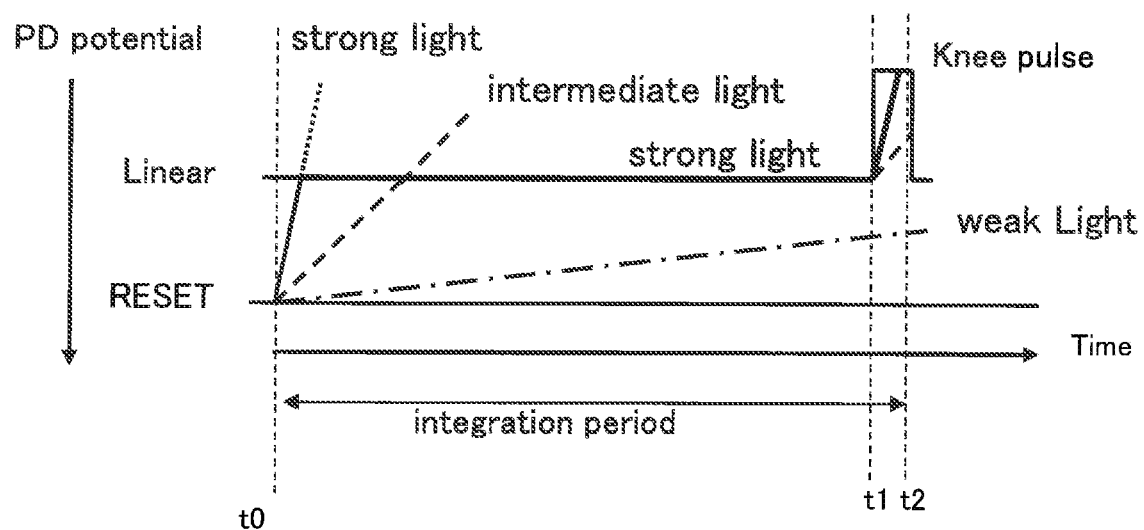
FIG. 2 is a diagram illustrating a temporal change of an output potential of a photodiode PD in a case where a knee pulse is applied.

FIG. 2 is a diagram illustrating a temporal change of an output potential of the photodiode PD in a case where the knee pulse is applied. In this example, the knee pulse is applied during a period from t1 to t2 at the end of an accumulation period from t0 to t2 corresponding to one frame. A vertical axis in FIG. 2 indicates the potential (plus on lower side) of the photodiode PD and a change of the potential caused by incident light. Here, the magnitude of the incident light is constant in one frame period. In a case of weak incident light, the potential is gradually lowered from a reset potential RESET (in drawing, potential is changed in upward direction because electron as signal is negative charge).

In a case of intermediate incident light, the potential reaches a potential in a linear saturation region in the middle of the accumulation period. When the knee pulse is applied at start time t1 of the knee pulse, the potential is again lowered. At time t2 at the end of the accumulation period, the potential becomes a potential corresponding to the incident light.

In a case of strong incident light, the potential reaches the saturation in the linear region in the middle of the accumulation period, and also reaches a knee potential during a knee period. After the potential reaches the knee potential, the potential enters a log region.

In FIG. 2, the potential in the case of the weak incident light is illustrated by an alternate long and short dash line, the potential in the case of the intermediate incident light is illustrated by a dashed line, and the potential in the case of the strong incident light is illustrated by a solid line.

Figure 3:
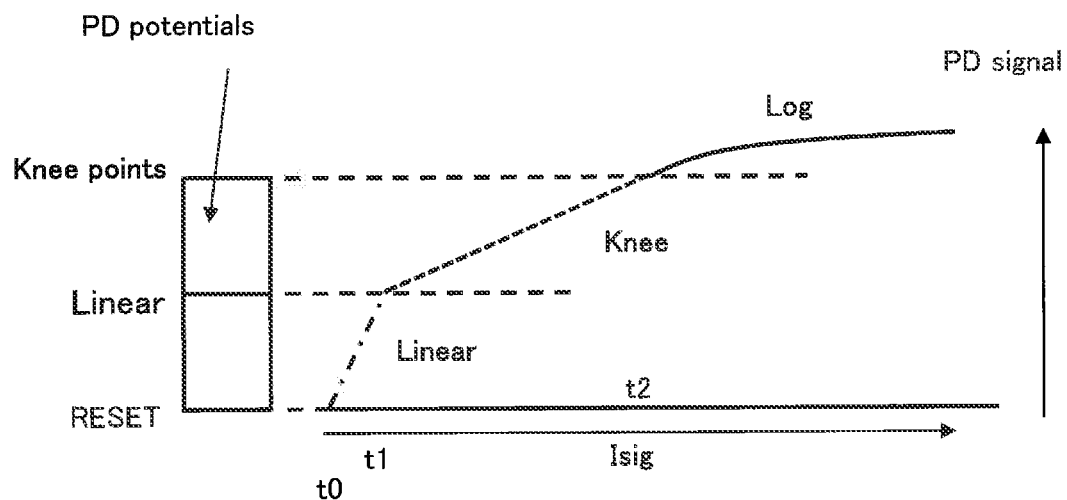
FIG. 3 is a graph in which a lateral axis indicates an incident light amount, and a vertical axis indicates an output signal of the photodiode PD.

FIG. 3 is a graph in which a lateral axis indicates an incident light amount and a vertical axis indicates the output signal of the photodiode PD. Sensitivity in a knee region is (t1−t2)/(t1−t0) with respect to sensitivity in the linear region.

As described above, the knee region is provided, which makes it possible to puts the photodiode PD that is once put into the saturated state, into the unsaturated state, and to accumulate charges.

Figure 4:
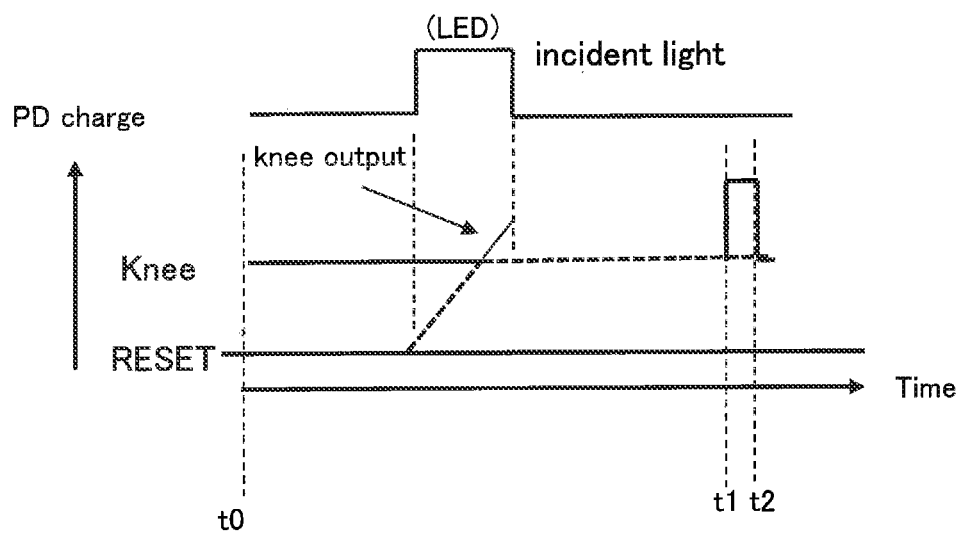
FIG. 4 is a graph illustrating a temporal change of an output of the photodiode PD in a case where an on period of the knee pulse and an incident timing of incident light are shifted from each other.

FIG. 2 and FIG. 3 each illustrate a case where the incident light is fixed, i.e. the magnitude of the incident right is constant in one frame period. On the other hand, an LED is used for a signal, and is repeatedly turned on and off. As illustrated in FIG. 4, in a case where an on period of the knee pulse and an incident timing of the incident light are shifted from each other, a knee output illustrated by a thin sold line in the drawing cannot be obtained, and the photodiode PD remains in the saturated state. Therefore, an advantage by application of the knee pulse cannot be obtained. If the incident light pulse exists in the period of t1~t2, the PDout and the PHout get knee output, i.e. the PDout and the PHout increase in the period of t1~t2. That means LED flicker occurs because the magnitude of the PDout and PHout is changed whether or not the incident light pulse exists in the period of t1~t2 or not.

Configuration of Pixel Circuit Using Plurality of Pulses

Figure 5:
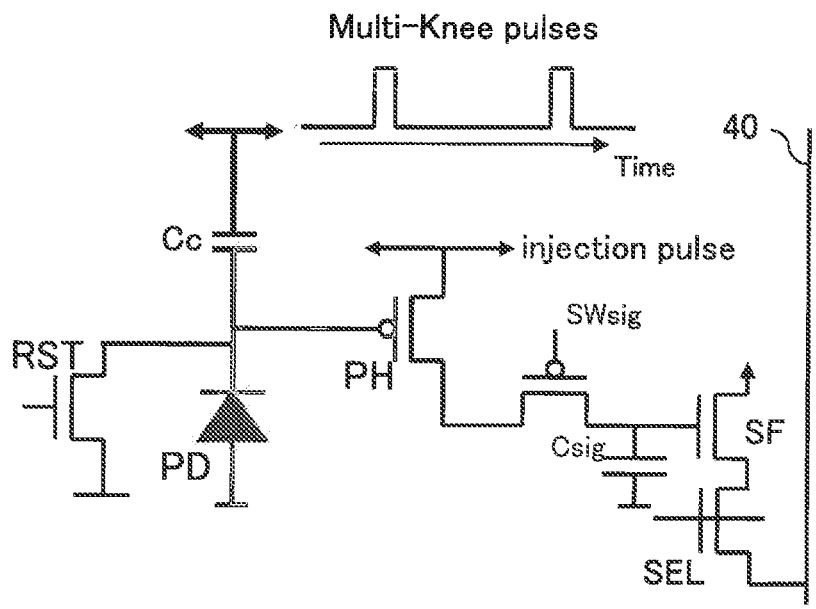
FIG. 5 is a diagram illustrating a configuration of a pixel circuit using a plurality of knee pulses.

FIG. 5 is a diagram illustrating a configuration of a pixel circuit using a plurality of knee pulses. Unlike FIG. 1, a multi-knee pulse in which a predetermined number of knee pulses are input during one frame is used.

In the example in FIG. 5, during an LED turn-on period, at least one knee pulse is generated to suppress a flicker phenomenon by the knee region.

A turn-on timing of the LED cannot be previously known. Therefore, it is necessary to generate the knee pulse at least once during the LED turn-on period by generating the knee pulse a sufficient number of times during the accumulation period (one frame period).

Further, as for the output of the photodiode PD, when the knee pulse is returned to off, the signal (signal having knee characteristics) changed by accumulation of the charges during the period of the knee pulse is returned to the saturation level in the linear region again. In the present embodiment, the peak hold circuit is connected to the output end of the photodiode PD. Therefore, the output of the peak hold circuit can be maintained at a level of the signal having the knee characteristics.

Figure 6:
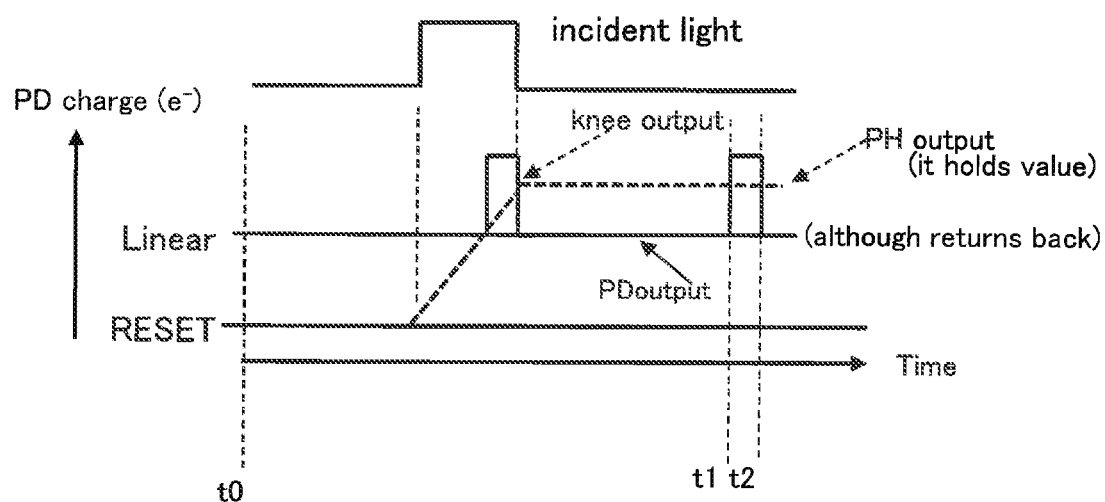
FIG. 6 is a timing chart illustrating operation of the circuit in FIG. 5 and is diagram illustrating a temporal change of the output of the photodiode PD.

FIG. 6 is a timing chart illustrating operation of the circuit in FIG. 5 and is a diagram illustrating a temporal change of the output of the photodiode PD. One knee pulse is generated while the incident light is present, and accordingly, charges (electrons) are further accumulated from the saturation level in the linear region. Further, even after the knee pulse is off, the signal level is maintained by the peak hold circuit. In other words, the peak hold circuit on a subsequent stage has characteristics of holding a peak value of the output of the photodiode PD. Accordingly, a flicker occurs in the output of the photodiode PD, whereas no flicker occurs in the output of the peak hold circuit.

The number of turn-on times of the LED in the signal is different depending on a manufacturer of the signal and the like. However, even in a case of the LED of any manufacturer, the flicker is not viewed by human eyes. Therefore, the number of turn-on/off times of the LED is estimated to be 100 times or more per second. In consideration of easiness of the control, the number of turn-on/off times of the LED is not considerably greater than 100 times per second. When the accumulation period of the sensor (period of one frame) is 33 ms (30 times/second), the number of turn-on times of the LED during the period is about three. Therefore, when the knee pulse is generated the number of times that is 10 times to 100 times the number of turn-on times of the LED (30 times to 300 times, per frames), the knee pulse generated at any timing corresponds to the turn-on period. Accordingly, in the present embodiment, the knee pulse is generated 30 times to 300 times during one frame period.

The output of the photodiode PD and the output of the peak hold circuit in a case where the one frame period is 10 ms and the pulse of the incident light enters three times were simulated.

In the output of the photodiode PD, a pulse (flicker) in which the voltage is varied occurs based on the knee pulse. When the light enters, a voltage value of the pulse of the output of the photodiode PD is shifted in response to the incident light.

The peak hold circuit shows a slow response and holds a peak of the output voltage of the photodiode PD. Therefore, in the output voltage of the peak hold circuit, the flicker caused by the knee pulse disappears. Further, it is found that the output voltage of the photodiode PD is integrated. Therefore, at the end of one frame, the same output is obtained even when the light enters at any timing. As described above, the flicker can be suppressed.

Figure 7:
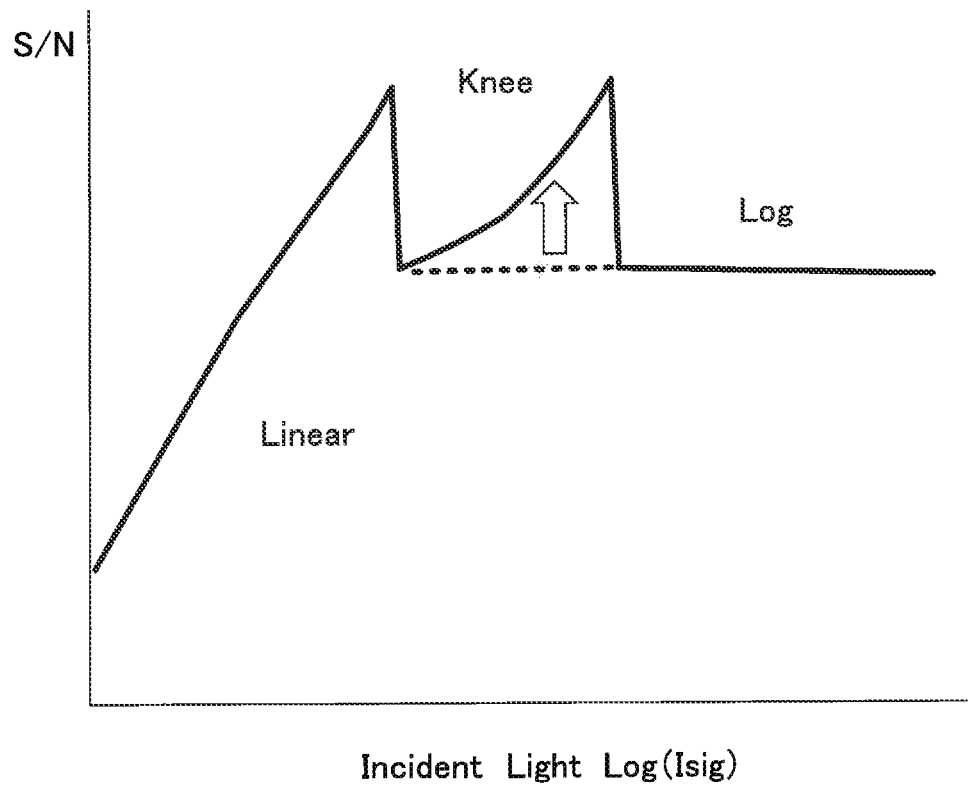
FIG. 7 is a diagram illustrating a change of S/N relative to the incident light amount.

FIG. 7 is a diagram illustrating a change of S/N relative to the incident light amount. As illustrated, in the log region, S/N is a ratio of kTC thermal noise $(kT/C)^{1/2}$ and a thermal voltage $kT/q$, and is substantially constant. In contrast, in the knee region, S/N is improved as compared with S/N in the log region. Therefore, using the knee pulse makes it possible to improve S/N in the knee region beyond the linear region.

Configuration of Image Sensor

Figure 8:
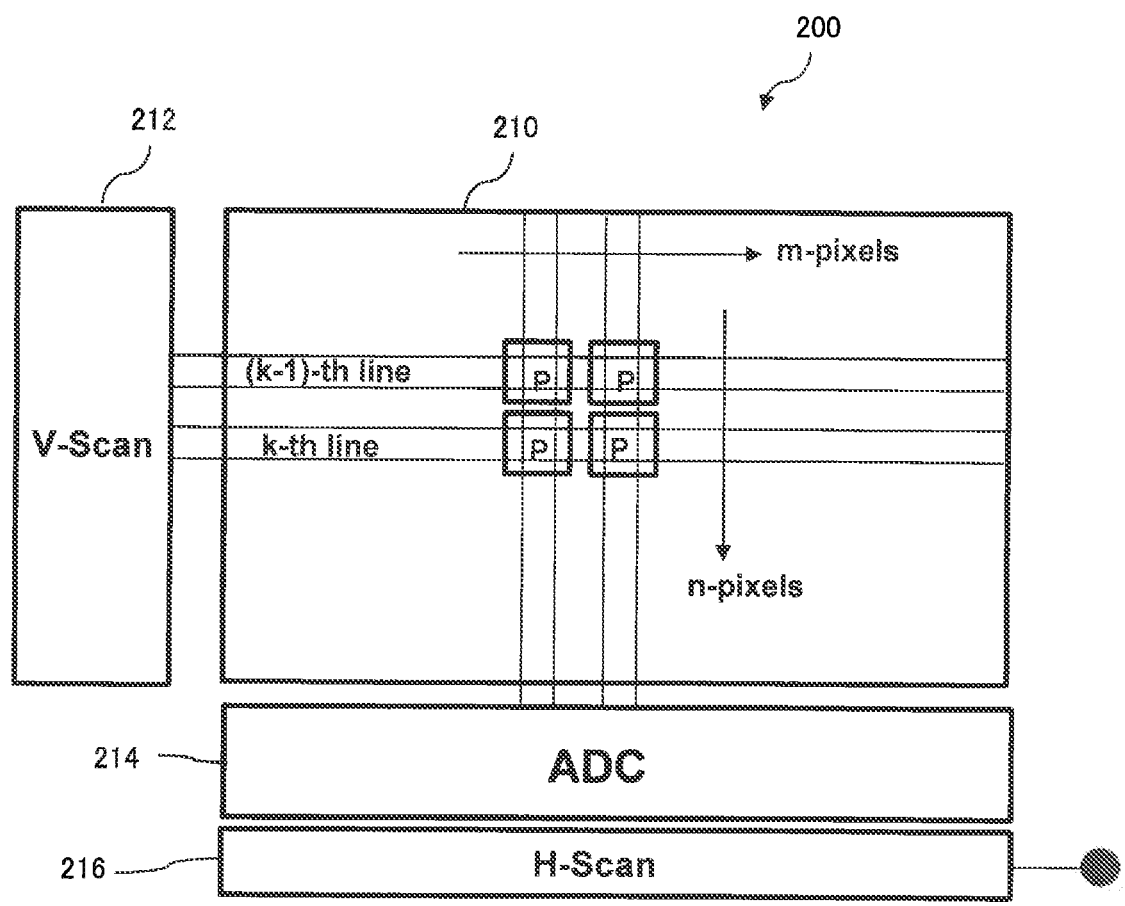
FIG. 8 is a diagram illustrating an image sensor in which pixels according to an embodiment are two-dimensionally arranged.

FIG. 8 is a diagram illustrating an image sensor 200 in which the pixels according to the embodiment are two-dimensionally arranged. A pixel array 210 includes pixels P as described above arranged in m columns*n rows (m*n), namely, includes m pixels in a horizontal direction and n pixels in a vertical direction. A vertical scan circuit (V-Scan) 212 sequentially selects rows of the pixels P in the vertical direction. The pixels in each column are connected to an analog-to-digital converter (ADC) 214 by a readout line in the vertical direction. A horizontal scan circuit (H-Scan) 216 is connected to the analog-to-digital converter (ADC) 214, and image signals of the respective pixels are sequentially output from the horizontal scan circuit (H-Scan) 216.

Figure 9:
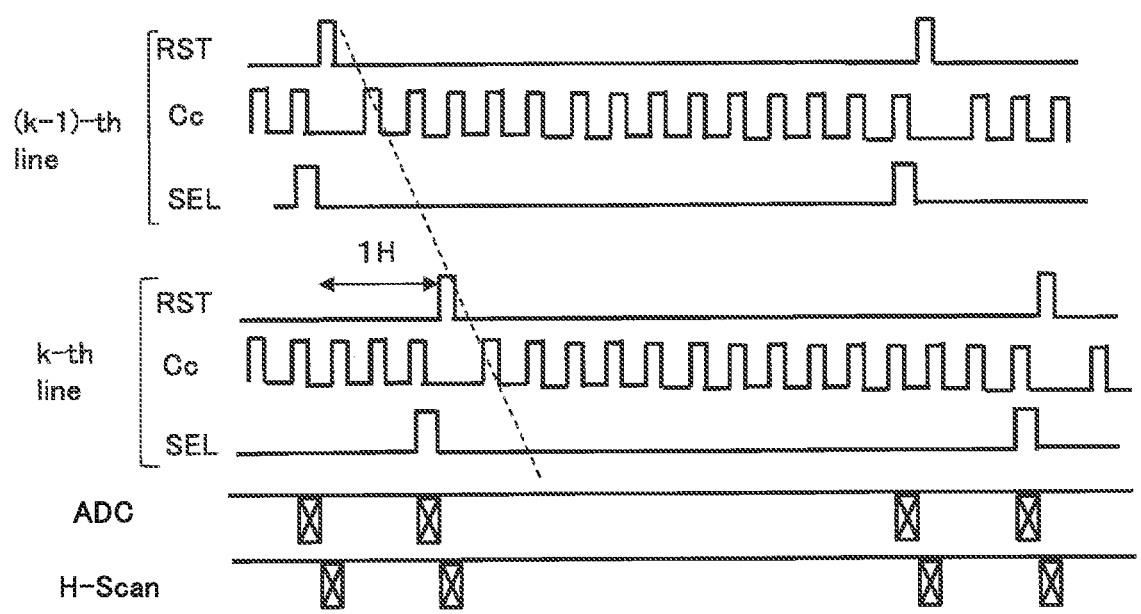
FIG. 9 is a timing chart illustrating operation of the image sensor.

FIG. 9 is a timing chart illustrating operation of the image sensor 200. In a (k−1)-th row, after two readouts end, the reset transistor RST is turned on to reset the photodiode PD. The reset is performed for each vertical period (1V=1Frame). Exposure starts after one reset. In addition, during an exposure period, the plurality of knee pulses (denoted by Cc in drawing) are applied through the knee capacitor Cc. The number of knee pulses is about 30 to about 300, and the knee pulses are illustrated in the drawing with the number of knee pulses reduced. Here, SWsig pulses are omitted.

First readout of the signal is performed shortly before next reset. The readout is performed in the above-described manner such that the selection transistor SEL is turned on, and the signal accumulated in the holding capacitor Csig is read out to the analog-to-digital converter (ADC) 214 through the output line 40. The analog-to-digital converter (ADC) 214 converts a plurality of analog P signals input from the plurality of pixels into a plurality of digital signals.

As described above, in a case where the signals of the respective pixels are prepared, the horizontal scan circuit (H-Scan) 212 sequentially outputs the signals of the m pixels.

Next, the same operation is performed on a k-th row by shifting the horizontal period by 1H. Signals of all of the m*n pixels can be read out by repeating the operation n times.

Figure 10:
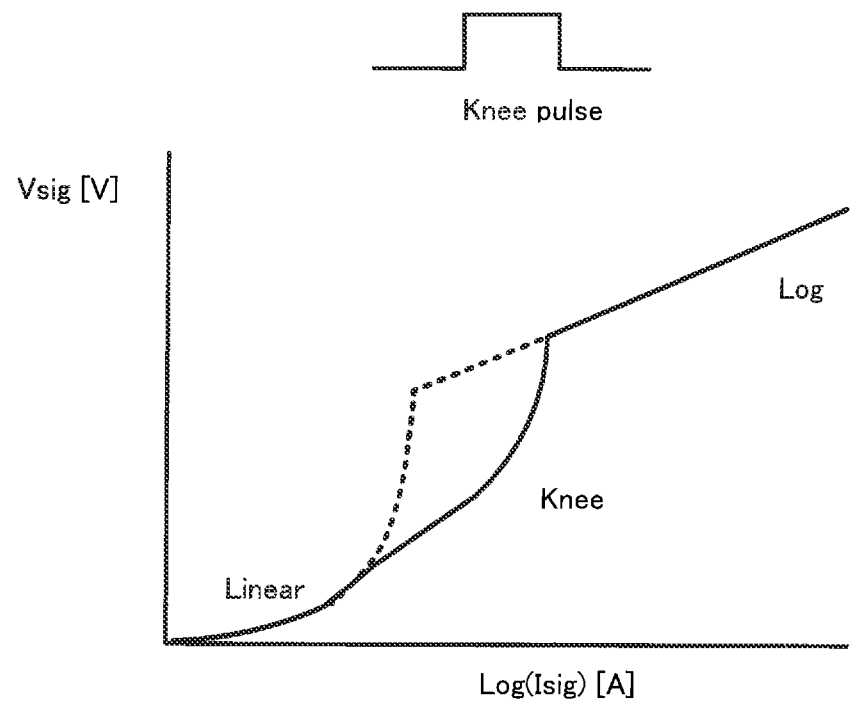
FIG. 10 is a diagram illustrating an exemplary curve of an output voltage Vsig of a peak hold circuit in a case where a lateral axis indicates a logarithm of the incident light (Log (Isig))

FIG. 10 is a diagram illustrating an exemplary curve of an output voltage Vsig of the peak hold circuit in a case where a lateral axis indicates a logarithm of the incident light (Log(Isig)).

A rectangular wave is used as the knee pulse. In the linear region, the output of the photodiode PD is not influenced by the knee pulse. In a case where the output of the photodiode PD is saturated and enters the log region, the knee region is formed, and the output is improved in the knee region. In the log region, the output of the photodiode PD is not influenced by the knee pulse as described above. Therefore, using the knee pulse makes it possible to increase the output in the knee region as illustrated by a dotted line in the drawing.

Figure 11:
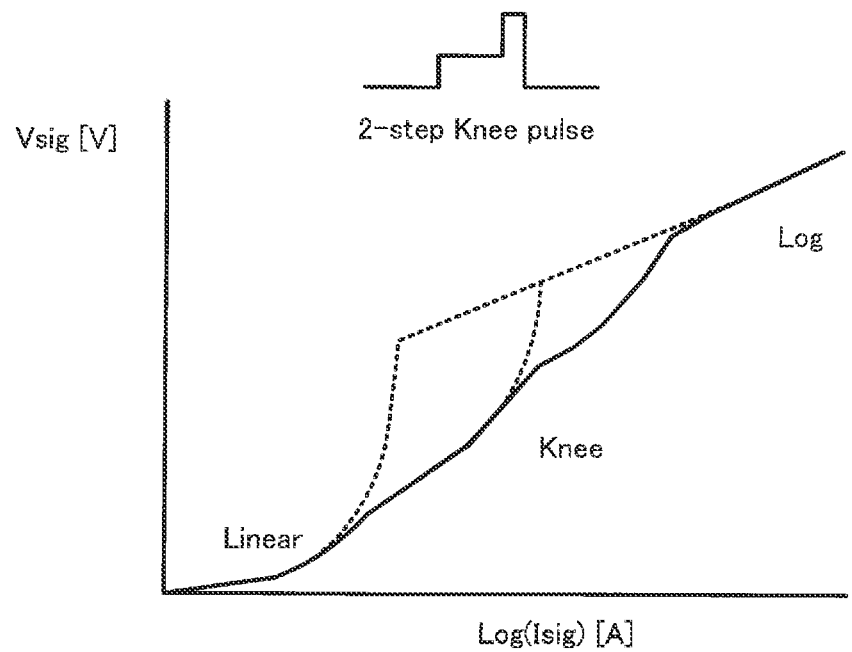
FIG. 11 is a diagram illustrating characteristics of an output voltage relative to the incident light in a case where a two-step pulse is used as the knee pulse.

FIG. 11 is a diagram illustrating characteristics of an output voltage relative to the incident light in a case where a two-step pulse is used as the knee pulse. As illustrated, when the two-step pulse is used, two knee regions appear, which makes it possible to widen the knee region. Accordingly, the dynamic range in the widened knee region can be further expanded. When two knee pulses are used, the photodiode PD can be returned to the unsaturated state after being saturated once, and the dynamic range can be expanded as compared with the case where the voltage of one knee pulse is increased.

What is claimed is:

1. An image sensor including a plurality of pixels, wherein
each of the pixels includes:
a photodiode configured to operate in a linear mode in which the photodiode shows a linear response to incident light and also in a photovoltaic mode in which the photodiode shows a logarithmic response to the incident light,
a reset transistor configured to reset the photodiode,
a peak hold circuit configured to integrate an output of the photodiode, wherein the peak hold circuit includes: (1) a peak hold transistor configured to receive an output of the photodiode at a gate, (2) a switch transistor configured to turn on/off an output of the peak hold transistor, and (3) a holding capacitor configured to accumulate an output of the switch transistor, and
a knee pulse supplying unit connected to an output end of the photodiode through a knee capacitor and configured to supply a knee pulse for shifting a voltage at the output end of the photodiode for a predetermined period, and
in a case where the photodiode is in a saturated state, the photodiode is transited from the saturated state to an unsaturated state during a period when the knee pulse is supplied from the knee pulse supplying unit.

2. The image sensor according to claim 1, wherein the knee pulse supplying unit supplies the knee pulse a multiple times during one frame period.

3. The image sensor according to claim 1, wherein the knee pulse supplying unit supplies the knee pulse 30 times to 300 times during one frame period.

4. The image sensor according to claim 1, wherein the knee pulse is a two-step pulse changed in a stepwise manner.

5. The image sensor according to claim 1, further comprising:
   a vertical scan circuit;
   a plurality of analog-to-digital converters; and
   a horizontal scan circuit, wherein
   the plurality of pixels are arranged in a matrix,
   the vertical scan circuit sequentially selects and drives, in a vertical direction, the plurality of pixels arranged in a horizontal direction,
   the analog-to-digital converter converts signals from the plurality of pixels selected by the vertical scan circuit into a plurality of digital signals, and
   the horizontal scan circuit serially outputs the plurality of digital signals.

6. The image sensor according to claim 5, wherein the knee pulse supplying unit supplies the knee pulse a multiple times during one frame period.

7. The image sensor according to claim 5, wherein the knee pulse supplying unit supplies the knee pulse 30 times to 300 times during one frame period.

8. The image sensor according to claim 5, wherein the knee pulse is a two-step pulse changed in a stepwise manner.

* * * * *